United States Patent [19]

Batchelder

[11] Patent Number: 5,472,502
[45] Date of Patent: Dec. 5, 1995

[54] APPARATUS AND METHOD FOR SPIN COATING WAFERS AND THE LIKE

[75] Inventor: William T. Batchelder, San Mateo, Calif.

[73] Assignee: Semiconductor Systems, Inc., Fremont, Calif.

[21] Appl. No.: 114,820

[22] Filed: Aug. 30, 1993

[51] Int. Cl.$^6$ ............................................ B05C 11/02
[52] U.S. Cl. ........................... 118/52; 118/56; 118/58; 118/63; 427/348
[58] Field of Search ............................. 118/52, 56, 58, 118/62, 63; 427/299, 348

[56] References Cited

U.S. PATENT DOCUMENTS

| 5,013,586 | 5/1991 | Cavazza | 427/240 |
| 5,158,860 | 10/1992 | Gulla et al. | 430/315 |
| 5,238,713 | 8/1993 | Sago et al. | 427/348 X |

FOREIGN PATENT DOCUMENTS

| 0176119 | 8/1986 | Japan | 118/63 |
| 0206224 | 9/1986 | Japan | 118/52 |
| 0092316 | 4/1987 | Japan | 118/52 |
| 0095626 | 4/1988 | Japan | 118/52 |
| 0098126 | 4/1990 | Japan | 118/52 |

OTHER PUBLICATIONS

Van Zant, Peter, "Microchip Fabrication. A Practical Guide to Semiconductor Processing." Published, 1986 by Semiconductor Services, San Jose, Calif., pp. 116–117.

Wolf, Stanley Ph.D and Tauber, Richard N. Ph.D., *Silicon Processing For The VLSI Era, vol. 1: Process Technology*, published by Lattice Press, Calif., pp. 429–430.

*Primary Examiner*—David A. Simmons
*Assistant Examiner*—Paul M. Rivard
*Attorney, Agent, or Firm*—Skjerven, Morrill, MacPherson, Franklin & Friel; David E. Steuber

[57] ABSTRACT

An apparatus and method are provided for controlling the rate of drying of a high-viscosity chemical applied to a substantially flat surface of a spinning article. The rate of drying of the chemical is controlled by controlling the saturation level of a solvent in the local atmosphere in which the article is spinning, i.e., in the air space adjacent to the surface of the article. By spinning the article in a solvent-laden vapor, the evaporation of solvent from the chemical is slowed and therefore the rate at which the chemical dries and thickens is also slowed. Spreading of the chemical may also be facilitated and premature drying of the chemical may be avoided by applying to the surface of the article a thin layer of the solvent prior to application of the chemical.

20 Claims, 11 Drawing Sheets

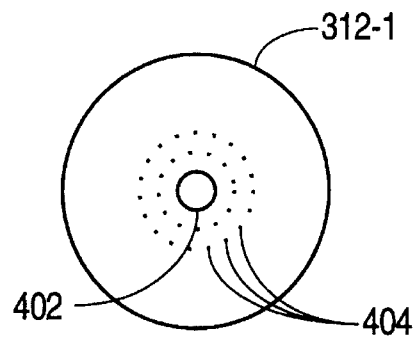
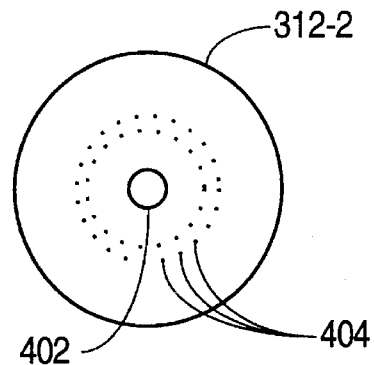
FIG. 4D    FIG. 4E
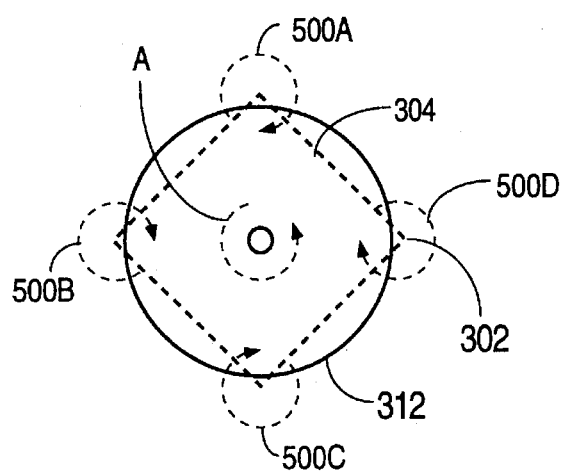
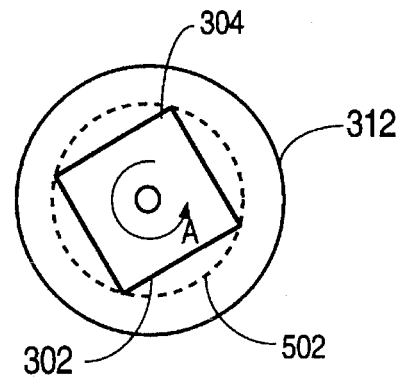
FIG. 5A    FIG. 5B

APPARATUS AND METHOD FOR SPIN COATING WAFERS AND THE LIKE

BACKGROUND OF THE INVENTION

1. Field of the Invention

The present invention relates to thin-film coatings of semiconductor wafers and flat panel displays, and in particular to spin coating large surfaces with photoresist and similar high-viscosity chemicals.

2. Description of the Prior Art

In the fabrication of semiconductor devices, a wafer is coated with photoresist or a similar high-viscosity liquid chemical by spinning the wafer and applying an amount of the chemical to the center of the spinning wafer. (As used herein, the term "liquid" is not limited to fluids of low-viscosity and, in fact, can refer to highly viscous chemical substances.) Until recently, spin coating has been mostly confined to coating circular surfaces or small square mask plates. However, spin coating is now used to apply chemicals to thin film heads, multi-chip modules, and flat panel displays which are square or rectangular and are often very large. Spin coating such surfaces presents primarily two problems.

First, the corners of a square or rectangular surface are poorly covered. The chemical being applied to the surface is spun to the edge where excess is thrown from the surface by centrifugal force. Chemical leaving the center of an edge is struck by the corner of the spinning surface as the corner is further from the center of the surface than is the center of an edge. Such a collision disrupts the even flow of chemical from the center of the surface to the corners of the surface.

Secondly, evaporation of solvent from the chemical and the cooling of the chemical as a result of such evaporation increases the viscosity of the chemical. Therefore, as the chemical spreads toward the edges of the spinning surface, the thickness of the coating of chemical on the surface increases. Such thickening over time causes a "bowl" shaped coating in which the coating is thinner near the center of the surface and thicker near the edges of the surface.

One solution to the latter problem of the chemical drying too soon on the spinning surface is to apply the chemical to a surface spinning at a normal speed and then to ramp up, i.e., gradually increase, the speed of the spinning surface as the chemical spreads. Increasing the spin rate spreads the chemical more quickly and potentially before the chemical thickens substantially. However, increasing the spinning speed of the surface creates another problem.

The surface tension of the chemical on the spinning surface is what causes the chemical to spread evenly during spinning. However, as the spinning rate is increased, the centrifugal force overcomes the surface tension of the chemical. This is especially true on larger surfaces such as large flat panel displays. When the surface tension is overcome, the smooth circular shape of the spreading chemical bursts like a bubble and the chemical then streams linearly toward the edges of the spinning surface in multiple radial paths. These multiple radial paths form striations in the coating of the spinning surface.

The radial gaps in coating between the striations are filled in by applying an excess of the chemical to the center of the spinning surface until radial flow of the chemical from the center of the surface, as a result of the extreme centrifugal force, fills in the uncoated area. Thus, the surface is coated by saturating the surface with chemical, most of which is discarded as waste. Furthermore, the uniformity of the coating is poor as a result of the striations in and drying of the chemical coating.

Excessive use of photoresist in particular is a significant problem in the art. Photoresist accounts for approximately 5% of the cost of materials for semiconductor devices and generally costs as much as $1,000 per gallon. Thus, excessive waste of photoresist significantly affects the cost of manufacturing semiconductor devices. Additionally, disposal of photoresist waste presents a substantial environmental burden on communities in which semiconductor devices are manufactured and on surrounding ecological systems. The problem is exacerbated when coating larger surfaces.

One solution found in the prior art is illustrated by FIG. 1. An object 102 to be coated with a chemical on surface 104 was placed on a spinning chuck 106 which was spun by a motor 108. A chemical was deposited on the center of surface 104 through a tube 110. The drying of the chemical during spreading of the chemical by centrifugal force was slowed by containment of solvent vapors evaporating from the chemical. Containment of some of the solvent vapor was accomplished by placing a lid 112 over and in close proximity to surface 104 during spinning.

The apparatus of FIG. 1 did not stop drying of the chemical altogether, but rather slowed the drying by trapping solvent vapors evaporating from the chemical. The apparatus of FIG. 1 provided no way to control the rate of drying of the chemical. Furthermore, excess chemical was thrown by centrifugal force from surface 104 to the inner surface of lid 112. Therefore, it was necessary to periodically clean lid 112 and such cleaning increased substantially the introduction of particle contaminants into the system and reduced the feasibility of automatic, high-speed manufacturing.

FIG. 2 shows another apparatus used in the prior art to slow the drying of a chemical in the spin coating of large or non-circular surfaces. Chemical 202 was placed at the center of surface 104 and a plate 204 was brought into close proximity to surface 104 during spinning. The object of having plate 204 in close proximity to surface 104 was to contain the solvent vapors evaporating from surface 104. The apparatus of FIG. 2 was only partially effective as plate 204 was stationary, causing surface effects and vortices in the air directly adjacent to surface 104, thereby causing chemical 202 to dry unevenly and failing to adequately slow the drying of chemical 202.

What is needed is a method and apparatus which allows greater control of the evaporation of solvent from a chemical as the chemical is applied to and spreads over a spinning surface. What is further needed is a method and apparatus by which drying of a chemical during spin coating is substantially slowed without substantially increasing the risk of contamination of the coated surface.

SUMMARY OF THE DISCLOSURE

An apparatus and method are provided for controlling the rate of drying of a high-viscosity, liquid chemical applied to a substantially flat surface of a spinning article. The chemical dries as centrifugal force spreads the chemical over the surface of the spinning article. The drying of the chemical results from the evaporation of a solvent from the chemical. The rate of drying of the chemical is controlled by controlling the saturation level of the solvent, i.e., the amount of solvent vapor, in the local atmosphere in which the article is spinning, i.e. in the airspace adjacent to the surface of the article. To control the saturation level of the solvent in the local atmosphere, a solvent vapor is introduced through a showerhead which is positioned in close proximity to the spinning surface. By spinning the article in a solvent-laden vapor, the evaporation of solvent from the chemical is slowed and therefore the rate at which the chemical dries and thickens is also slowed. No lid or cover is used around the periphery of the spinning article which would be splattered by chemical spilling off the edge of the article and which would necessitate cleaning and the increased potential for surface contamination.

According to a second aspect of the invention, spreading of the chemical is facilitated and premature drying of the chemical is avoided by applying to the surface of the article a thin layer of the solvent prior to application of the chemical. The chemical flow is enhanced locally at the surface of the spinning article causing the chemical to flow more smoothly and evenly toward the edges of the surface, even when using slower spin speeds.

BRIEF DESCRIPTION OF THE DRAWINGS

FIGS. 4D and 4E are views of respective undersides of showerheads constructed in accordance with second and third embodiments of the present invention.

FIGS. 5A and 5B are top views of a showerhead and a spinning article in accordance with the present invention.

DETAILED DESCRIPTION OF PREFERRED EMBODIMENTS

Figure 1:
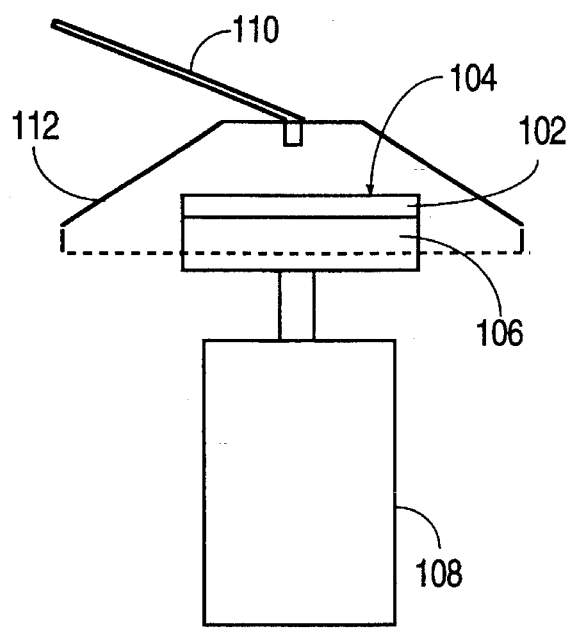
FIG. 1 is a diagram of a spin coating apparatus of the prior art.
Figure 2:
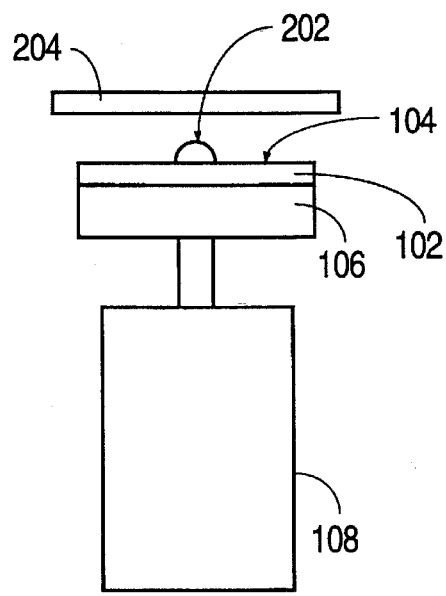
FIG. 2 is a diagram of a spin coating apparatus of the prior art.

An apparatus and method are provided for controlling the rate of drying of a chemical applied to a substantially flat surface of a spinning article. The rate of drying of the chemical is controlled by controlling the saturation level of a solvent in the local atmosphere in which the article is spinning. The solvent in the local atmosphere is a solvent present in the chemical, the drying of the chemical being accomplished by the evaporation of the solvent from the chemical. By spinning the article in a solvent-laden gas, the evaporation of solvent from the chemical is slowed and therefore the rate at which the chemical dries and thickens is also slowed. No lid or cover is used around the periphery of the spinning article, since such a lid or cover would be splattered by chemical spilling off the edge of the article and which would necessitate cleaning and the increased potential for surface contamination. In one embodiment, which is described below, article 302 is covered while spinning. However, no lid or cover extends below surface 304 which could therefore be contaminated during the spin-coating of surface 304. Since there is positive solvent-laden gas flow from the center of the surface and no air from beyond the spinning surface is pulled into the air space adjacent the surface, complete control of the environment adjacent to the surface is attained.

An article 302 (FIG. 3) having a surface 304 is securely held by a chuck 306. In one embodiment, article 302 is securely held to chuck 306 by applying a vacuum to the underside of article 302 as is done routinely in the art. Chuck 306 and article 302 are spun by a motor 308 at a controllable rate. An amount of a chemical containing a solvent is placed on the center of surface 304 through a chemical tube 310. In another embodiment, which is described below, the chemical is introduced through a hollow arm which is moved to a position between showerhead 312 and surface 304. The centrifugal force resulting from the spinning of surface 304 of article 302 spreads the chemical evenly and uniformly over surface 304. As the solvent evaporates from the chemical, the chemical dries on surface 304.

During the spinning of surface 304, a vapor source 316 creates a gaseous mixture of nitrogen, or some other generally non-reactive gas, and the solvent, which is introduced into a showerhead 312 through a gas tube 314. Vapor source 316 is described in greater detail below. As used herein, the term "non-reactive" means that the gas does not generally react with either the solvent or the chemical at room temperature. Another non-reactive gas is ordinary air. The gaseous mixture is sometimes referred to herein as "the solvent vapor". The solvent vapor is dispersed through showerhead 312 into the area immediately adjacent to surface 304. As the airspace adjacent to surface 304 has an increased saturation level of the solvent, evaporation of the solvent from the chemical deposited on surface 304, and hence the drying of the chemical, is slowed. As a result, the chemical flows more smoothly in response to the centrifugal force of the spinning of surface 304 and coats surface 304 more smoothly and uniformly. Additionally, as described more completely below, surface 304 can be spun at a slower speed and the chemical can spread to cover the entirety of surface 304 before drying. Thus, the chemical spreads smoothly and evenly toward the edge of surface 304. No striations are formed in the chemical coating on surface 304.

Showerhead 312 (FIG. 4A) has a hole 402 therethrough at the center so that the viscous chemical can be introduced through chemical tube 310 (FIG. 3) during operation. As discussed below, the chemical can be introduced through an arm, which can be positioned between showerhead 312 and surface 304. Showerhead 312 (FIG. 4A) has in its underside a number of perforations 404 through which solvent vapor is dispersed. In one embodiment, perforations 404 have a diameter of 0.002 inches and are spaced approximately one-half inch apart. On the topmost side of showerhead 312 (FIG. 4B) is an opening 406 through which solvent vapor is introduced into showerhead 312. While a circular shape is shown for showerhead 312 (FIGS. 4A–4E), the showerhead can be any shape, e.g., rectangular, as long as showerhead 312 covers a substantial portion of surface 304, as described more completely below.

Solvent vapor is introduced through opening 406 (FIG. 4C) into a chamber 408 of showerhead 312. Chamber 408 is an annular airspace which is filled with solvent vapor. The solvent vapor then flows through perforations 404 so as to be uniformly dispersed through the underside of showerhead 312.

When article 302 (FIG. 5A) is spun in close proximity to showerhead 312 in the direction of arrow A, vortices are formed as shown by arrows 500A, 500B, 500C and 500D. Such vortices move solvent vapor from between showerhead 312 and surface 304 and move surrounding air to the space between showerhead 312 and surface 304. Moving the surrounding air into close proximity to surface 304 can cause premature drying of the chemical and undesirable thickening in the chemical coating of surface 304. This is prevented by ensuring (a) that showerhead 312 (i) is in sufficiently close proximity to surface 304 and (ii) covers substantially the entirety of surface 304 and (b) that the amount of solvent vapor dispersed through showerhead 312 is sufficient to replace the amount of air spun from surface 304, as described below.

As discussed above, the prevention of vortices between showerhead 312 and surface 304 depends on the distance between showerhead 312 and surface 304 and the rate at which surface 304 spins. Additionally, if showerhead 312 is positioned too closely to surface 304, solvent vapor emanating from perforations 404 (FIG. 4B) can erode chemical from surface 304 (FIG. 5A), causing ring-shaped erosion of chemical from spinning surface 304. Good results have been obtained with showerhead 312 spaced from surface 304 one-half of an inch.

While satisfactory results are obtained when the surface area of the underside of showerhead 312 covers at least a substantial part of surface 304, it is preferred that the entirety of surface 304 is covered by the underside of showerhead 312 including some overhang as a margin of safety. For example, surface 304 (FIG. 5B), when spun in the direction of arrow A, occupies an area defined by circle 502. Showerhead 312 is circular and occupies a concentric circular area exceeding the are of circle 502 by a 10% safety margin. Good results are obtained when showerhead 312 occupies a concentric circular area which is 100% to 110% of the area defined by surface 304 as it spins, i.e., of the area of circle 502.

It is preferred that the amount by which the diameter of showerhead 312 exceeds the diameter of the space occupied by surface 304 during spinning does not exceed approximately 10%. As chemical is thrown from the edge of surface 304, the chemical collides with air surrounding surface 304 and travels in paths which deviate from the plane in which surface 304 spins. Some of this chemical leaves surface 304 on upward trajectories with angles as high as 15° from the plane in which surface 304 spins. If showerhead 312 is excessively large, chemical is more likely to contact showerhead 312, thereby requiring cleaning of showerhead 312 and increasing the likelihood of particle contaminants being introduced during the spin coating process. Thus, it is preferred that the diameter of showerhead 312 does not exceed the diameter of the area occupied by surface 304 during spinning by more than approximately 10%.

Thus, if showerhead 312 is sufficiently large and sufficiently close to surface 304, the likelihood that "dry" air, i.e., air which is not laden with solvent vapor, will be pulled into contact with chemical spreading over surface 304 is substantially reduced. However, air in the local atmosphere adjacent to surface 304 is thrown from the area adjacent to surface 304 by centrifugal force similar to the force which spreads chemical over surface 304. The throwing of air from the local atmosphere leaves a reduced pressure in the airspace adjacent to surface 304. This reduced pressure creates the vortices described above.

Such a reduced pressure over surface 304 is avoided by dispersing a sufficient volume of solvent vapor through showerhead 312 to compensate for the volume of air thrown from the airspace adjacent to surface 304. In other words, the flow rate of the solvent vapor through showerhead 312 is equal to the rate at which air is thrown from the local atmosphere plus some additional amount included as a margin of safety. For example, the flow rate of solvent vapor can be increased by 20% to provide this safety margin. In one embodiment, solvent vapor is introduced into showerhead 312 at a rate of 25–50 SCFH (standard cubic feet per hour).

Figure 4A:
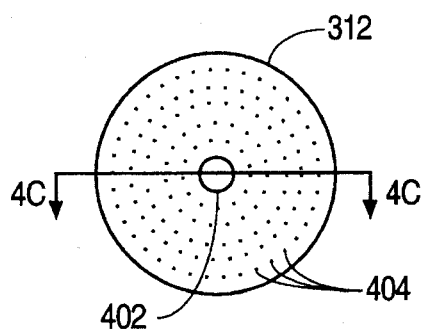
FIG. 4A is a view of the underside of a showerhead constructed in accordance with the present invention.

While FIG. 4A shows that the entire underside of showerhead 312 is perforated with perforations 404, such is not necessary for satisfactory performance of the present invention. Alternative embodiments of showerhead 312 are shown in FIGS. 4D and 4E. FIG. 4D shows a showerhead 312-1 in which perforations 404 are located within a circular region of the underside of showerhead 312-1. The circular region is concentric with the center of rotation of surface 304 (not shown in FIG. 4D) and has a diameter which is substantially less than the diameter of showerhead 312-1.

Showerhead 312-1 produces satisfactory results as solvent vapor dispersed at the center of spinning surface 304 (FIG. 3) is moved out toward the outer edges of spinning surface 304 by the same centrifugal force which spreads the chemical over surface 304. No dry air comes into contact with surface 304 (a) as showerhead 312-1 (FIG. 4D) is positioned in close proximity to surface 304 (FIG. 3) and covers substantially the entire area of surface 304 and (b) as the flow rate of solvent vapor through showerhead 312-1 is sufficient to replace air thrown from the airspace adjacent to surface 304.

Showerhead 312-2 (FIG. 4E) has perforations 404 positioned in the underside of showerhead 312-2 to form a ring which is concentric with the center of rotation of surface 304 (not shown in FIG. 4E). Showerhead 312-2 functions as described above with respect to showerhead 312-1 (FIG. 4D). However, since there is less solvent vapor dispersed inside the ring of perforations 404 (FIG. 4E), chemical near the center of surface 304 (FIG. 3) is allowed to dry at a faster rate than the center would dry if solvent vapor is dispersed directly over the center. Since chemical placed at the center of surface 304 initially has not dried appreciably, it is not as important to slow the drying of the chemical at the center of surface 304. Showerhead 312-2 (FIG. 4E) allows the center of surface 304 (FIG. 3) to dry at a faster rate while allowing the rate of drying of surface 304 away from the center of surface 304 to be controlled as described herein.

The disclosed embodiment of the present invention represents a significant improvement over the prior art as the rate of drying of the chemical on spinning surface 304 can be varied widely. The placement of showerhead 312 in close proximity to surface 304 inhibits the evaporation of solvent from the chemical. Introducing solvent vapor through showerhead 312 slows drying of chemical on surface 304 even further. Introducing larger amounts of solvent vapor through showerhead 312 can minimize the drying process and prevent admixture of dry air in the airspace adjacent to surface 304.

By slowing the drying of chemical, surface 304 can be spun at slower speeds even when spin coating rather large surfaces. Favorable results have been obtained in coating surfaces as large as 14 inches by 16 inches. Slower spin speeds allow improved process control since the chemical spreads evenly toward the edges of surface 304 without uneven drying. Additionally, slower spin speeds allows chemical leaving the center of an edge of a square surface to fall sufficiently to avoid colliding with the corner of a square or rectangular surface. Furthermore, back splash is prevented, yielding a cleaner process. "Back splash" refers to contamination of the underside of article 302 (FIG. 3), which extends beyond chuck 306, by a mist of chemical which is caused by the turbulence of spinning article 302 and the chemical thrown from spinning surface 304. Thus, slower spin speeds improve the coating of corners of square and rectangular surfaces and reduce the likelihood of contamination.

The particular spin speed which provides a particularly good coating depends on the following factors: (1) the size of surface 304, (2) the particular solvent contained by the chemical, (3) the amount of the solvent in the chemical, (4) the temperature of the chemical, and (5) the desired thickness of the chemical coating. One embodiment of the present invention coats a 14-inch by 16-inch rectangular substrate with a coating of Shipley Microposit XP-90190-21 photoresist chemical with a thickness of 1.5 microns. Shipley Microposit XP-90190-21 is available from The Shipley Company of Newton, Mass. The disclosed embodiment of the present invention can accurately coat surfaces to any of a wide range of thicknesses. The thickness that is desired is determined by the particular application for which the surface is coated. In the particular use of the present invention described herein, 1.5 microns is defined as the desired resulting thickness of the coating of surface 304.

For the particular solvent and the amount of solvent in the Shipley Microposit XP-90190-21 chemical when the chemical is at a temperature of approximately 20° to 22° C., particularly good results are obtained with a spin speed of 1000 rpm to 1500 rpm. To properly coat the 14-inch by 16-inch surface, showerhead 312 is circular and approximately 21 inches in diameter.

In particularly large surfaces, good results have been obtained by wetting surface 304 with solvent prior to application of chemical. Solvent is introduced as solvent vapor through showerhead 312 which then condenses on surface 304 or is deposited directly on surface 304 through chemical tube 310. Surface 304 is spun until the solvent is about 1,000 Å thick. A series of circular interference fringes flowing from the center of surface 304 can be visually observed when the solvent approaches 1,000 Å.

Chemical is applied to surface 304 with 1,000 Å thick layer of solvent coating surface 304. As chemical comes into contact with surface 304, the layer of solvent facilitates chemical flow. Thus, coating of surface 304 can be accomplished at substantially reduced spin speeds as less centrifugal force is required to draw the chemical to the edges of surface 304. Additionally, since very little solvent is present on surface 304 when chemical is introduced, the solvent is quickly absorbed by the chemical and therefore has no detectable effect on the thickness of the coating of chemical produced.

Figure 6:
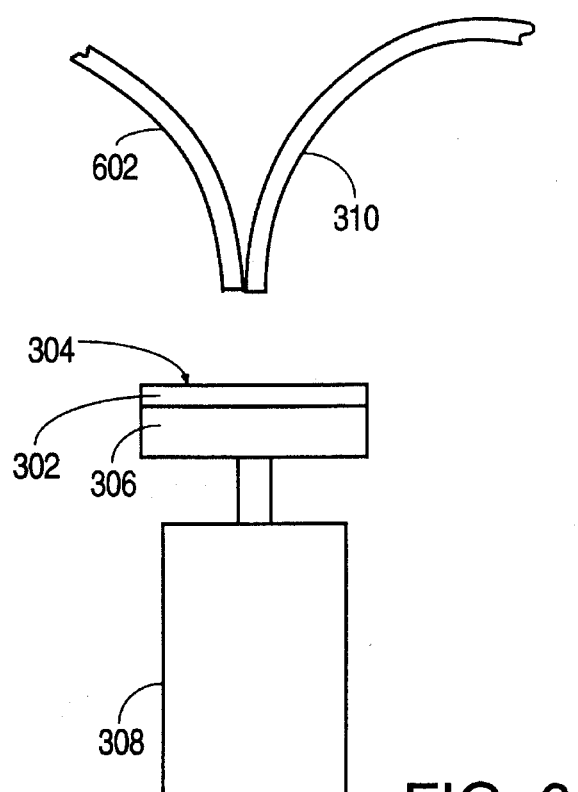
FIG. 6 is a diagram of a spin coating apparatus constructed in accordance with a second embodiment of the present invention.

An embodiment of the invention in which surface 304 is wetted with solvent immediately prior to applying chemical to surface 304 is shown in FIG. 6. Solvent is introduced to the center of surface 304 through a solvent tube 602 and an amount of chemical is subsequently introduced through chemical tube 310. Solvent tube 602 is displaced from the center of surface 304 and is therefore angled at an open end such that solvent introduced through the open end will be deposited on the center of surface 304.

Figure 7:
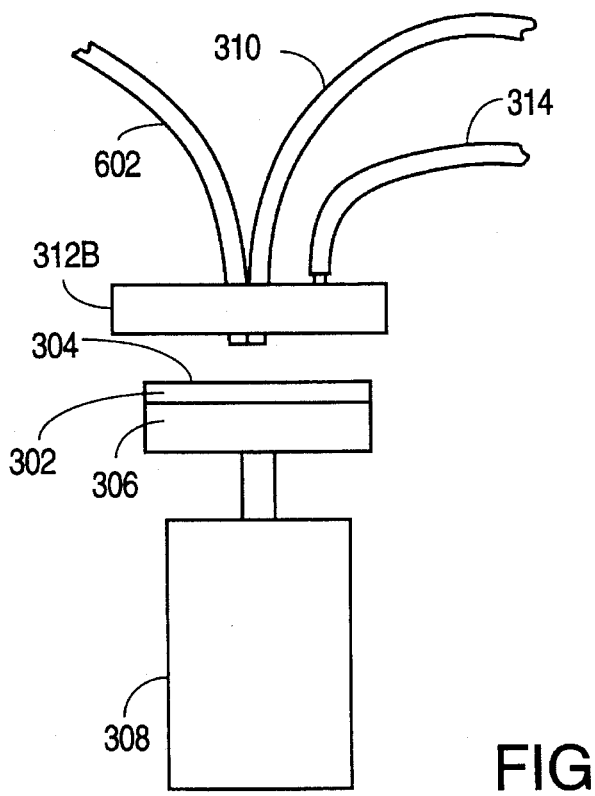
FIG. 7 is a diagram of a spin coating apparatus constructed in accordance with a third embodiment of the present invention.
Figure 8:
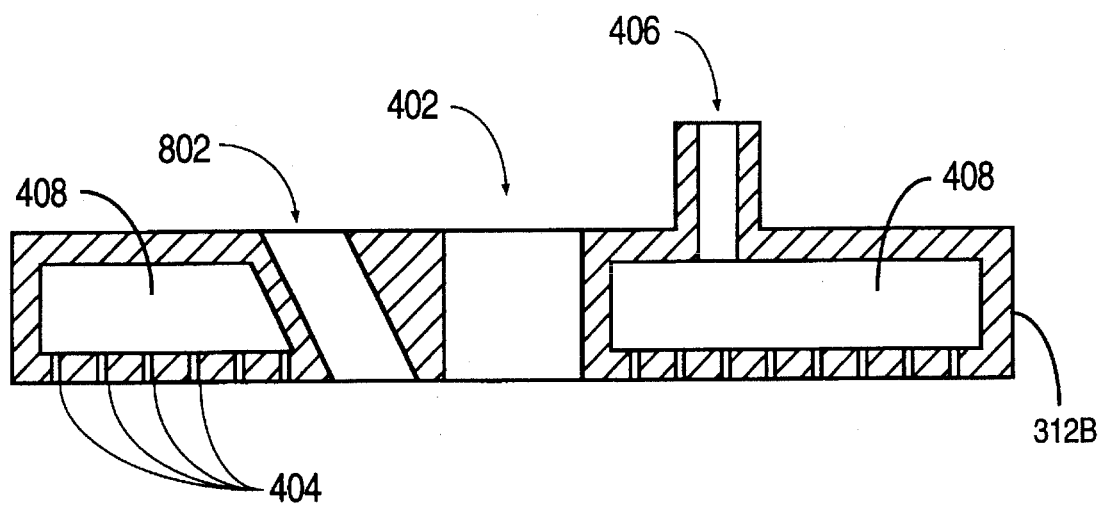
FIG. 8 is a cross-sectional view of a showerhead constructed in accordance with the third embodiment of the present invention.

FIG. 7 shows the embodiment of FIG. 6 wherein solvent tube 602 and chemical tube 310 are used in conjunction with showerhead 312B. Showerhead 312B (FIG. 8) is as described above with respect to showerhead 312 with the exception that showerhead 312B has a hole 802 for receiving solvent tube 602.

Figure 9:
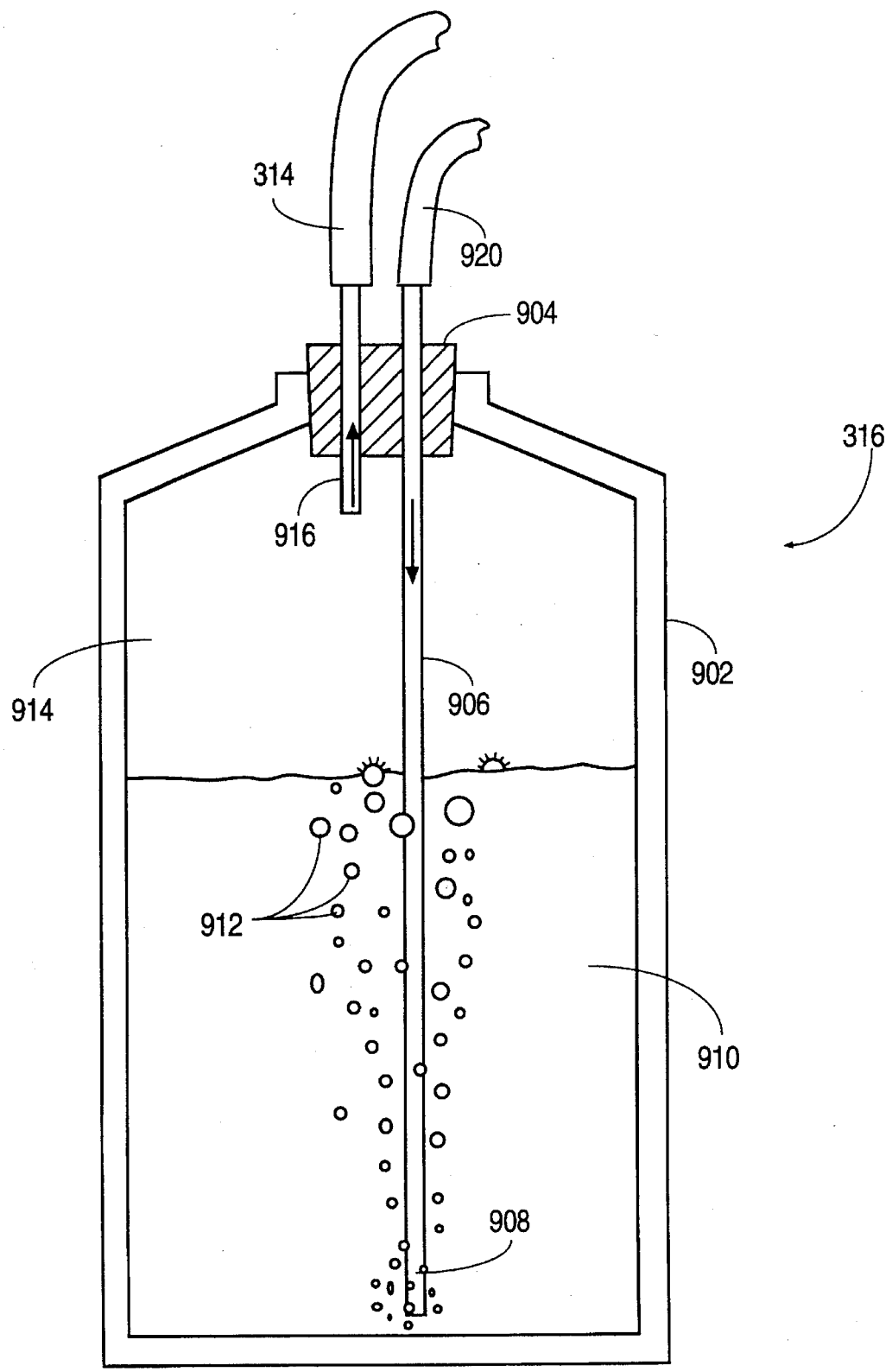
FIG. 9 is a cross-sectional view of a solvent vapor source constructed in accordance with the present invention.

Vapor source 316 (FIG. 3) is shown in greater detail in FIG. 9. A tank 902 is partially filled with a solvent 910. For example, in conjunction with Shipley Microposit XP-90190-21, solvent 910 can be Shipley EBR-10 or Shipley EC11, both of which are available from The Shipley Company of Newton, Mass. A seal 904 is used to seal in an airspace 914 above solvent 910 in tank 902. A gaseous diffusion tube 906 passes through seal 904 and extends to near the bottom of tank 902. Gaseous diffusion tube 906 has a fritted glass end 908 which is emersed in solvent 910. An output tube 916 also passes through seal 904 but, unlike gaseous diffusion tube 906, does not reach solvent 910. Instead, an open end of output tube 916 is in airspace 914.

Figure 3:
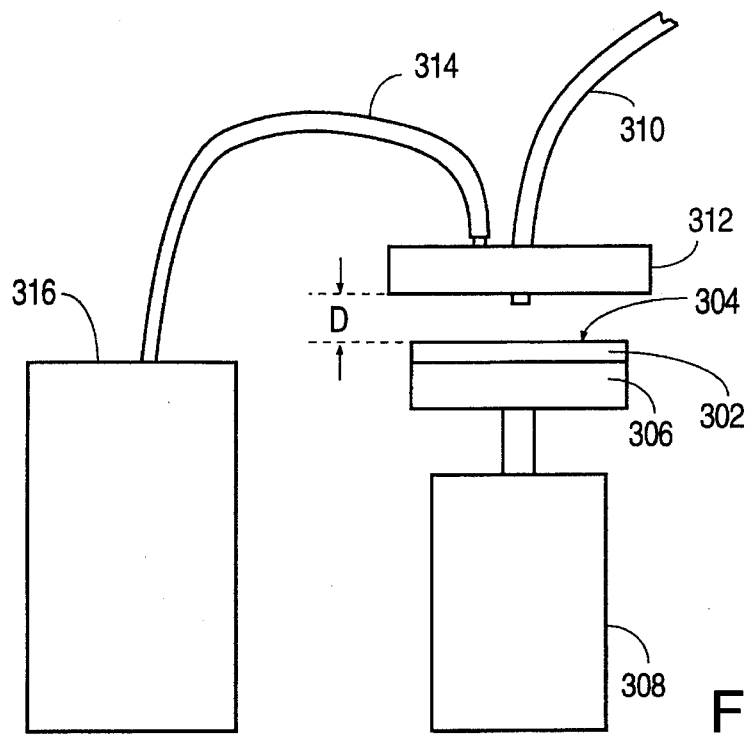
FIG. 3 is a diagram of a spin coating apparatus constructed in accordance with the present invention.
Figure 4B:
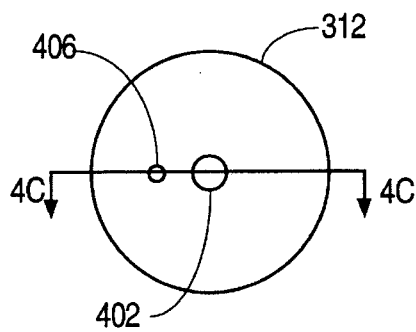
FIG. 4B is a top view of a showerhead constructed in accordance with the present invention.
Figure 4C:
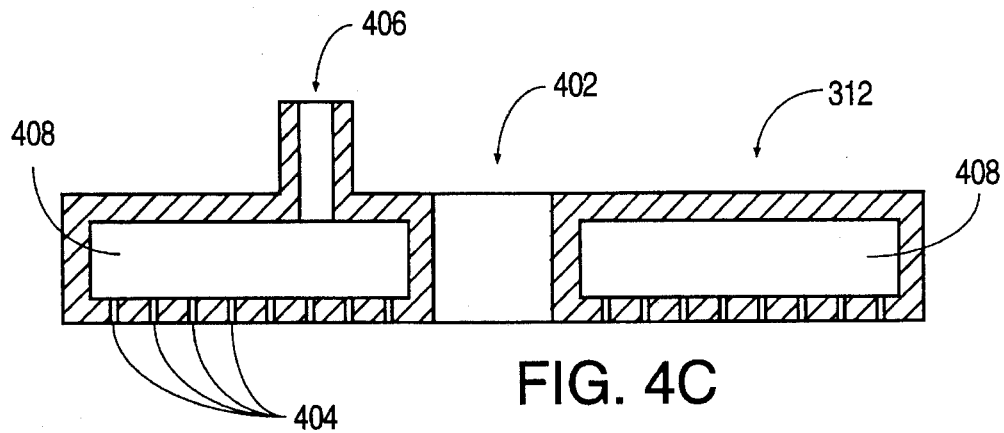
FIG. 4C is a cross-sectional view of a showerhead constructed in accordance with the present invention.

Vapor source 316 operates as follows. Nitrogen gas, or other generally non-reactive gas such as ordinary air, is introduced through a tube 920 into gaseous diffusion tube 906. For example, tube 920 can be connected to an air pump or nitrogen gas source (neither shown). The nitrogen gas passes through gaseous diffusion tube 906 to fritted glass end 908 at which point the nitrogen gas passes through fritted glass end 908 into solvent 910 thereby forming bubbles 910. As bubbles 912 are formed in solvent 910 and pass through solvent 912 to airspace 914, bubbles 912 become saturated with solvent vapor. Seal 904 is air-tight such that solvent vapor from airspace 914 flows through output tube 916 at the same rate at which nitrogen gas is introduced through tube 920. Solvent vapor passes through output tube 916 to gas tube 314 and therethrough to showerhead 312 (FIG. 3).

Thus, by introducing nitrogen gas through tube 920 (FIG. 9) of vapor source 316 at a specific rate, solvent vapor flows through gas tube 314 at that same specific rate. The amount of solvent vapor that can be produced by vapor source 316 is limited by the rate at which nitrogen gas can flow through fritted glass end 908. For some applications of the present invention which require particularly heavy flow of solvent vapor, a second embodiment of a vapor source (FIG. 10) provides increased solvent vapor capacity.

Inside chamber 408 of showerhead 312C, immediately above perforations 404, is a solvent-absorbent, gas permeable, annular filter 1006. Also inside chamber 408 of showerhead 312C is a drip tube 1002. Drip tube 1002 has perforations 1004 along a length near an end 1002E of drip tube 1002. End 1002E is sealed. Perforations 1004 are all within chamber 408 and a port 1002P through which drip tube 1002 passes through the outer wall of showerhead 312 is sealed such that no gas can pass through port 1002P.

A solvent in liquid form is introduced through drip tube 1002 into chamber 408 of showerhead 312C. The solvent drips through perforations 1004 and saturates filter 1006. Gas tube 314 (FIG. 3) is connected to a source of nitrogen gas or of any other generally non-reactive gas. In this illustrative example, gas tube 314 is connected to a source of nitrogen. Nitrogen gas is introduced through opening 406 (FIG. 10) into chamber 408. Nitrogen gas passes through filter 1006. As nitrogen gas passes through filter 1006, which is saturated with liquid solvent as described above, the nitrogen gas becomes saturated with solvent vapor. The solvent-laden nitrogen gas then passes through perforations 404 as described above.

Figure 10:
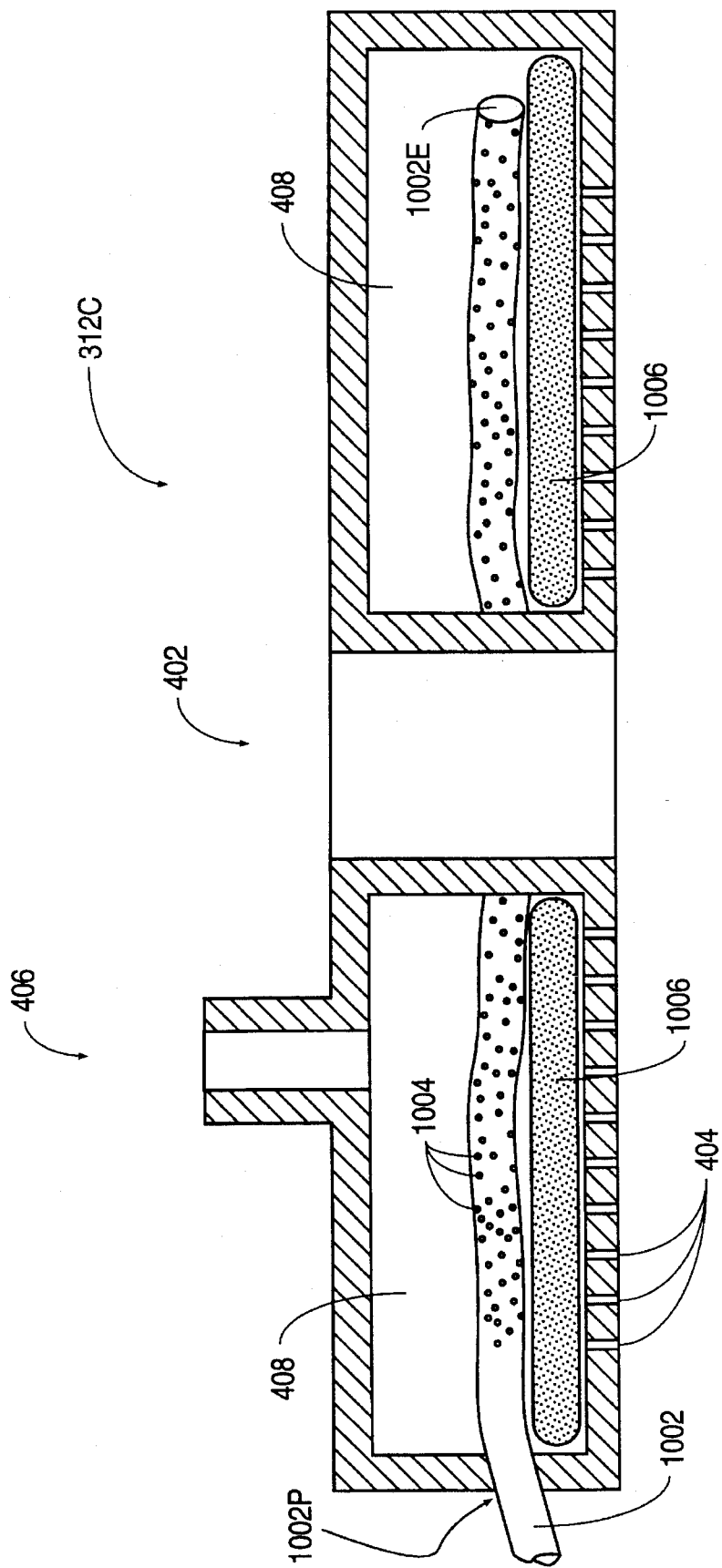
FIG. 10 is a cross-sectional view of a combination solvent vapor source and showerhead constructed in accordance with a fourth embodiment of the present invention.

Thus, FIG. 10 illustrates a second embodiment of a vapor source in accordance with the present invention in which solvent vapor is formed by passing nitrogen gas through a solvent saturated, gas permeable filter.

Figure 11A:
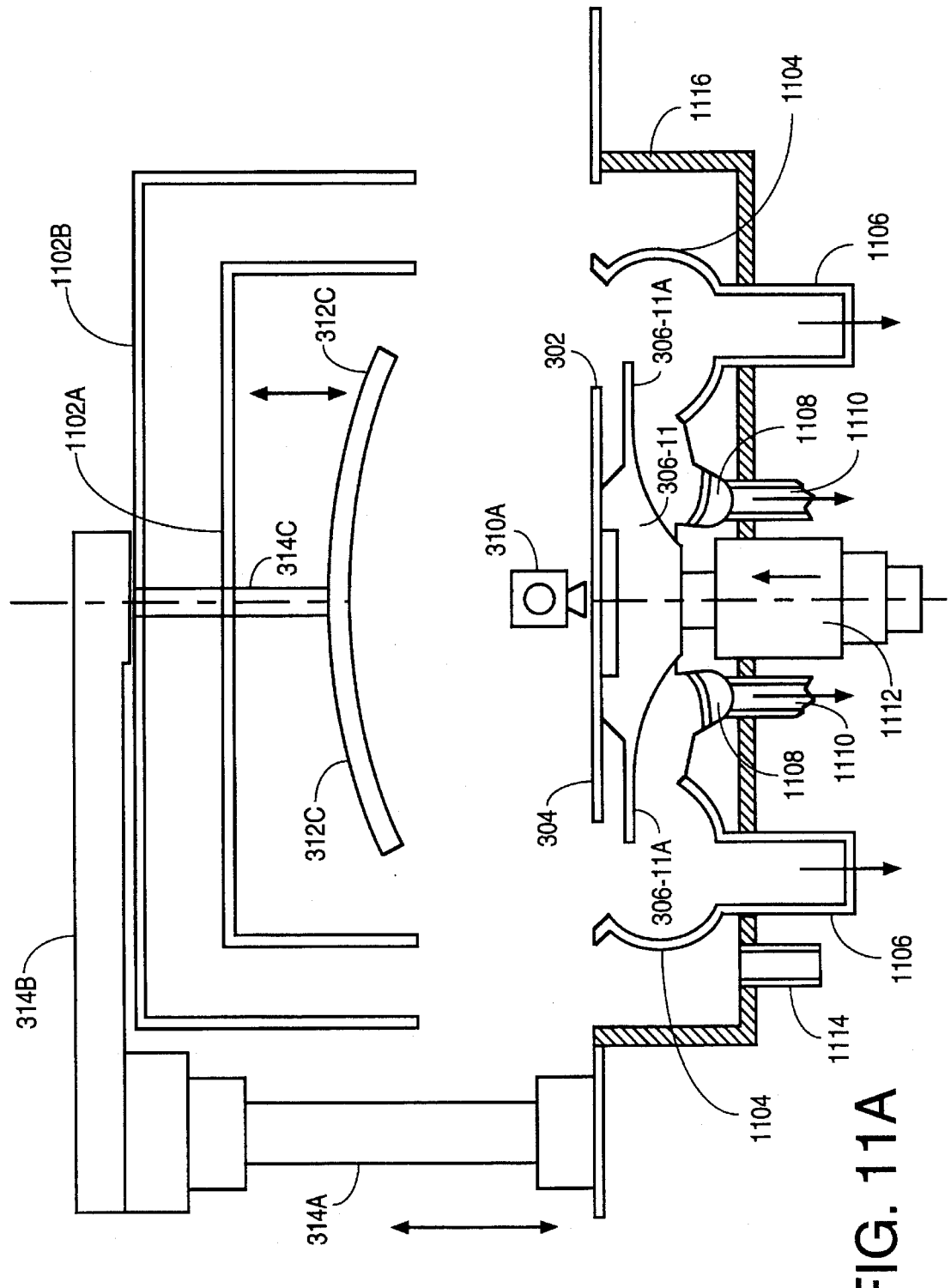
FIGS. 11A and 11B are cross-sectional views of a spin-coating assembly formed in accordance with a fifth embodiment of the present invention.
Figure 11B:
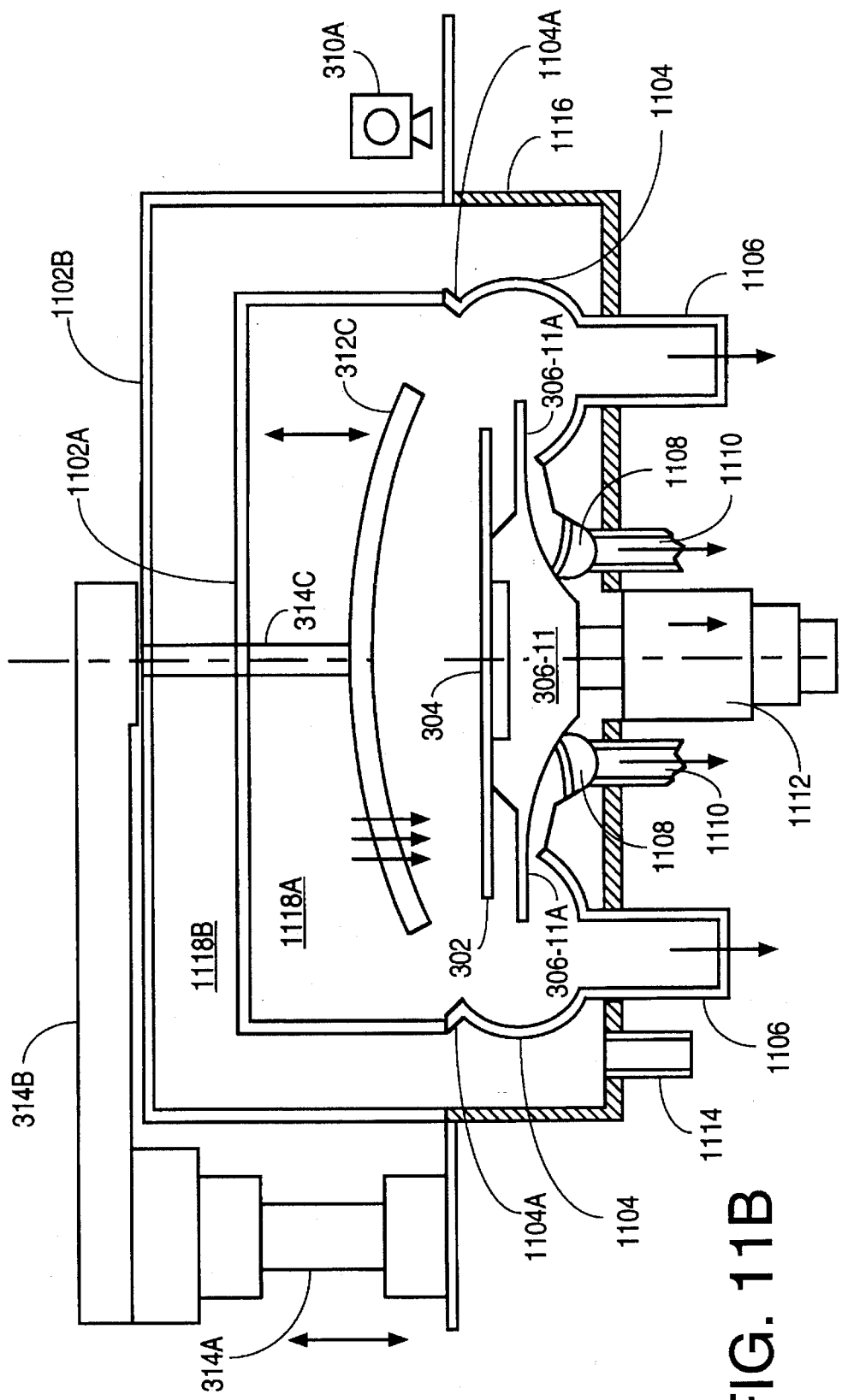
Figure 12A:
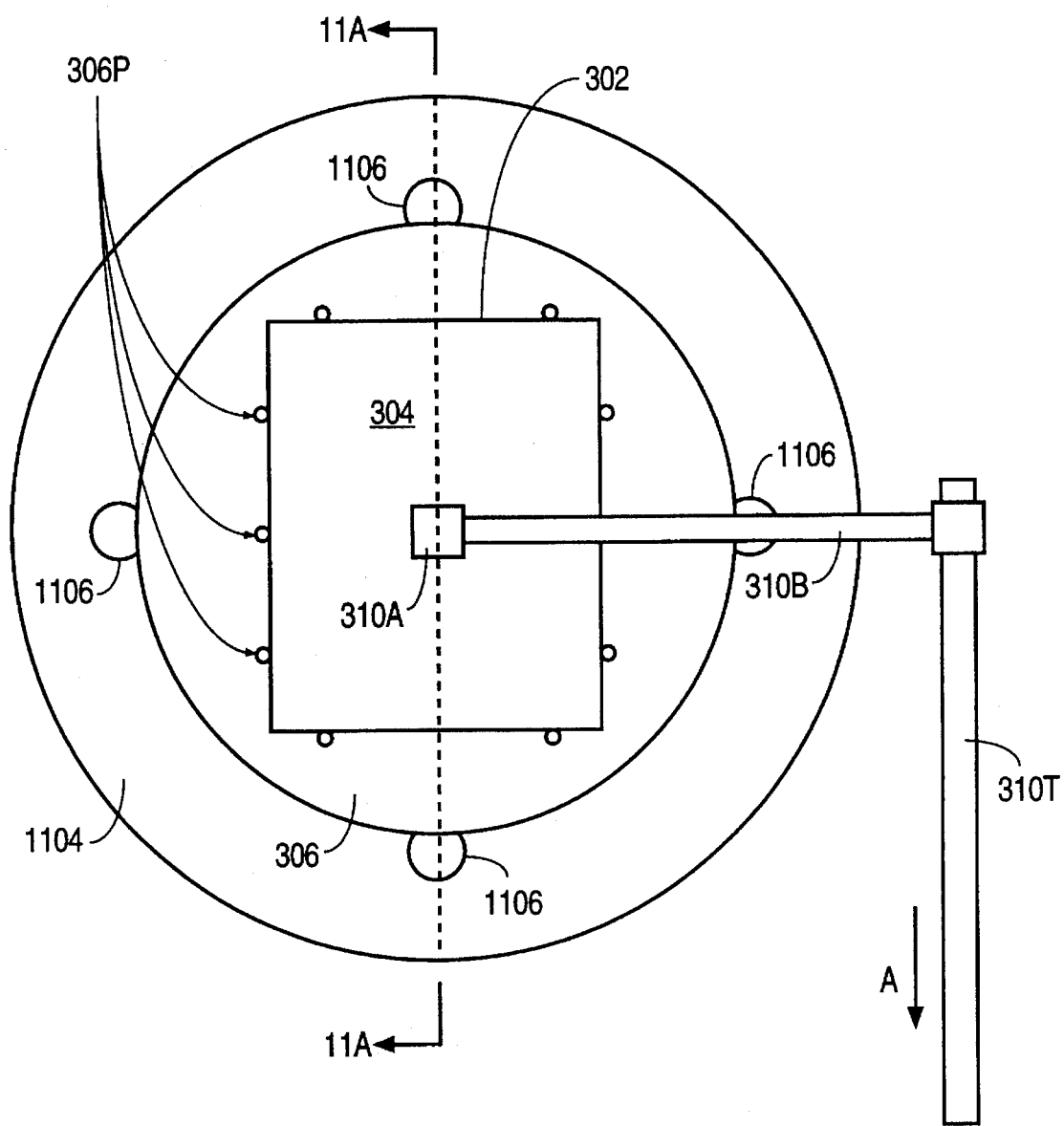
FIGS. 12A and 12B are plan views of a portion of the spin-coating assembly of FIGS. 11A and 11B.

Another embodiment of the present invention is shown in FIGS. 11A, 11B, 12A, and 12B. Article 302 is secured to chuck 306-11 by applying a vacuum through chuck 306-11 to the underside of article 302 as is commonly done in the art. As a safety precaution, article 302 is held in place on chuck 306 by several retaining pins 306P (FIG. 12A). Chuck 306-11 (FIG. 11A) is raised to receive article 302 as bearing 1112 allows chuck 306-11 to be moved in the vertical direction. Dispensing head 310A is positioned over the center of surface 304 of article 302 as shown in FIGS. 11A and 12A. Dispensing head 310A and dispensing arm 310B (FIG. 12A) are hollow and are connected so as to permit chemical to be dispensed through dispensing arm 310B to dispensing head 310A and therethrough onto surface 304. Once chemical is dispensed onto surface 304, dispensing arm 310B and dispensing head 310A are moved along track 310T in the direction of arrow A to the position indicated in FIG. 12B.

Above surface 304 (FIG. 11A) is showerhead 312C. Showerhead 312C is curved so as to redirect solvent vapor from the edge of spinning surface 304 to the center of spinning surface 304. Since chemical is dispensed through dispensing head 310A, there is no need for a hole in the center of showerhead 312C to perform this function (see hole 402 (FIG. 4A) of showerhead 312). Showerhead 312C (FIG. 11A) is supported by solvent vapor supply channel 314C through which solvent vapor is introduced to showerhead 312C. Solvent vapor supply channel 314C is connected to solvent vapor supply channel 314B and therethrough to solvent vapor supply channel 314A. Positioned between showerhead 312C and solvent vapor supply channel 314B are a primary containment 1102A and a secondary containment 1102B which contain chemical and solvent vapor for the protection of human operators of the apparatus shown in FIGS. 11A and 11B. Solvent vapor supply channel 314A is movable in the vertical direction. As solvent vapor supply channel 314A is connected to solvent vapor supply channels 314B and 314C, primary containment 1102A, secondary containment 1102B, and showerhead 312, movement of solvent vapor supply channel 314A causes corresponding movement of solvent vapor supply channels 314B and 314C, primary containment 1102A, secondary containment 1102B, and showerhead 312C. Solvent vapor supply channels 314A, 314B, and 314C; showerhead 312C; primary containment 1102A; and secondary containment 1102B are shown in the "up" position in FIG. 11A.

Figure 12B:
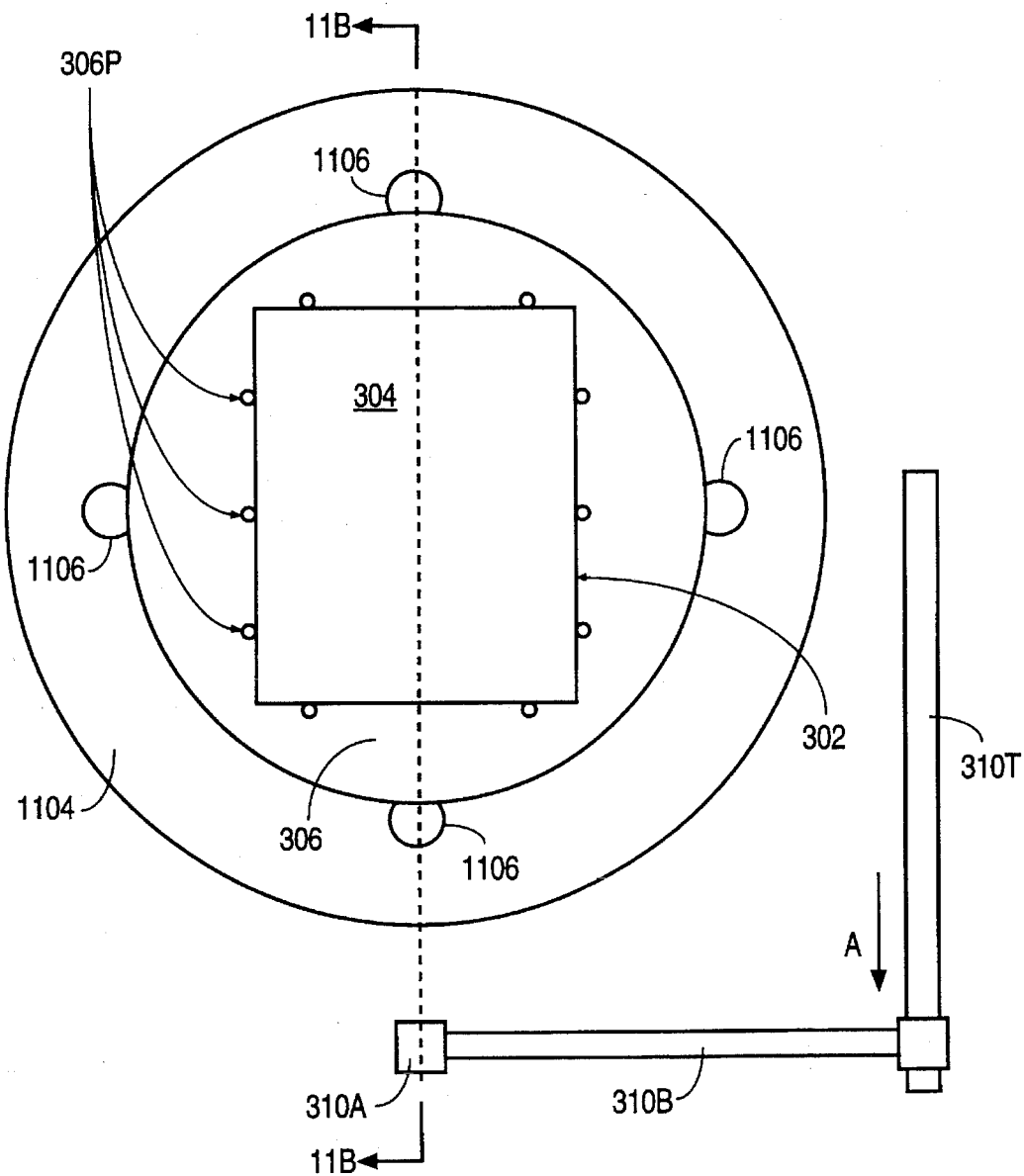

After chemical is dispensed through dispensing head 310A through dispensing arm 310B, dispensing head 310A and dispensing arm 310B are moved along track 310T to the position shown in FIGS. 12B and 11B. Solvent vapor supply channels 314A, 314B and 314C are then lowered as shown in FIG. 11B. Primary containment 1102A is positioned against a bowl liner 1104 so as to form a primary sealed chamber 1118A. Bowl liner 1104 can be made of plastic inexpensively and can therefore be made disposable. Secondary containment 1102B contacts a support structure 1116 to thereby form a secondary sealed chamber 1118B which surrounds primary sealed chamber 1118A. Additionally, the lowering of solvent vapor supply 314C lowers showerhead 312C into close proximity with surface 304.

Using bearing 1112, chuck 306-11 is lowered so as to position surface 304 below lip 1104A of bowl liner 1104. Bowl liner 1104 is shaped such that chemical thrown from surface 304 which strikes bowl liner 1104 below lip 1104A is directed toward a drain 1106 through which excess chemical is collected. Additionally, excess solvent vapor and chemical mist are drawn through an exhaust port 1108 and an exhaust manifold 1110. By directing excess chemical to drain 1106 and by directing excess solvent vapor and chemical mist through exhaust port 1108 to exhaust manifold 1110, the likelihood of back splash on the underside of article 302 is reduced. To further reduce the likelihood of back splash on the underside of article 302, ends 306-11A of chuck 306-11 extend beyond the underside of article 302. Any vapors of chemical escaping the seal between bowl liner 1104 and primary containment 1102A are drawn from secondary containment chamber 1118B through port 1114 in support structure 1116. Thus, human operators operating the apparatus shown in FIGS. 11A, 11B, 12A and 12B are protected from any ill effects of chemical mist or solvent vapor.

While specific embodiments are disclosed herein, the disclosed embodiments are illustrative only and are not to be limiting of the present invention. The present invention is therefore limited only by the claims which follow.

What is claimed is:

1. An apparatus for applying a layer of a liquid to a surface of an article, said apparatus comprising:

means for spinning said article about an axis;

means for depositing on said article surface a quantity of said liquid such that spinning said article surface spreads said liquid over said article surface;

means for dispersing a gas containing a solvent in close proximity to said article surface so as to retard the drying of said liquid during spreading, said means for dispersing comprising a showerhead.

2. The apparatus of claim 1 wherein said article surface is substantially planar.

3. The apparatus of claim 1 wherein said showerhead comprises a gas-permeable surface.

4. The apparatus of claim 3 wherein said gas-permeable surface is at least about the size of said article surface.

5. The apparatus of claim 3 wherein said gas-permeable surface is circular and has a diameter that is no more than about 110% of the diameter of an area defined by said article surface when said article surface is spun about a center.

6. The apparatus of claim 3 wherein said gas-permeable surface is positioned approximately one-half of an inch from said article surface.

7. The apparatus of claim 3 wherein said gas-permeable surface is positioned substantially parallel to said article surface.

8. An apparatus for applying a layer of a liquid to a surface of an article wherein said liquid includes a solvent, said apparatus comprising:

a chuck for receiving and securing said article;

means for spinning said chuck so as to spin said article surface about an axis;

means for depositing on said article surface a quantity of said liquid such that spinning said article surface will spread said liquid over said article surface;

a showerhead having a chamber and a gas-permeable surface which is positioned in proximity to said article surface along said axis;

a solvent vapor source for forming a solvent vapor;

means connected between said solvent vapor source and said showerhead for introducing said solvent vapor into said chamber so as to allow said solvent vapor to permeate said gas-permeable surface into close proximity to said article surface so as to retard the drying of said liquid.

9. The apparatus of claim 8 wherein said showerhead extends parallel to said article surface so as to cover a substantial portion thereof.

10. The apparatus of claim 8 wherein said article surface is substantially planar.

11. The apparatus of claim 8 wherein said gas-permeable surface is at least about the size of said article surface.

12. The apparatus of claim 11 wherein said gas-permeable surface is circular and has a diameter that is no more than about 110% of the diameter of an area defined by said article surface when said article surface is spun about a center.

13. The apparatus of claim 8 wherein said gas-permeable surface is positioned within about one-half inch from said article surface.

14. The apparatus of claim 8 wherein said gas-permeable surface is positioned substantially parallel to said article surface.

15. A method for applying a layer of a liquid to a surface of an article, said method comprising:

spinning said article surface about an axis;

depositing on said article surface a quantity of said liquid such that spinning said article surface will spread said liquid over said article surface;

dispersing through a showerhead a gas containing a solvent to a region in close proximity to said article surface so as to retard the drying of said liquid during spreading.

16. The method of claim 15 further comprising the step of applying a quantity of a second solvent to said article surface.

17. The method of claim 16 wherein said step of applying a quantity of said solvent is performed prior to said step of depositing.

18. The method of claim 16 further comprising the step of spinning said article surface so as to spread said solvent over said article surface to form a thin layer of solvent on said article surface.

19. A method for applying a thin layer of a liquid to a surface of an article, said method comprising:

applying a quantity of a solvent to said article surface so as to form a coating of said solvent on said article surface;

applying a quantity of said liquid to said coating of said solvent so as to thin said liquid at the point of contact between said liquid and said article surface; and spinning said article surface so as to spread said liquid over said article surface, wherein said step of applying a quantity of said solvent is performed so as to form a uniform coating of solvent on said article surface wherein said coating is approximately 1,000 Å in thickness.

20. The method of claim 16 wherein said first-mentioned solvent and said second solvent are the same.

* * * * *